United States Patent [19]
Coronel et al.

[11] Patent Number: 5,658,418
[45] Date of Patent: Aug. 19, 1997

[54] APPARATUS FOR MONITORING THE DRY ETCHING OF A DIELECTRIC FILM TO A GIVEN THICKNESS IN AN INTEGRATED CIRCUIT

[75] Inventors: Philippe Coronel, Massy; Jean Canteloup, Montlhery, both of France

[73] Assignee: International Business Machines Corporation, Armonk, N.Y.

[21] Appl. No.: 536,900

[22] Filed: Sep. 29, 1995

[30] Foreign Application Priority Data

Mar. 31, 1995 [EP] European Pat. Off. ............ 95480031

[51] Int. Cl.$^6$ ........................................ H01L 21/66
[52] U.S. Cl. ..................... 156/345; 216/60; 216/67; 216/79; 438/9; 438/16
[58] Field of Search .................. 156/626.1, 643.1, 156/646.1, 345; 216/58, 60, 65–67, 85

[56] References Cited

U.S. PATENT DOCUMENTS

| | | | |
|---|---|---|---|
| 4,767,495 | 8/1988 | Nishioka | 156/626.1 |
| 4,851,311 | 7/1989 | Millis et al. | 156/626.1 |
| 5,392,124 | 2/1995 | Barbee et al. | 216/85 |
| 5,405,488 | 4/1995 | Dimitrelis et al. | 216/60 |
| 5,465,154 | 11/1995 | Levy | 156/626.1 |

FOREIGN PATENT DOCUMENTS

| | | |
|---|---|---|
| 0 511 448 A1 | 4/1991 | European Pat. Off. . |
| WO 94/25977 | 4/1994 | WIPO . |

OTHER PUBLICATIONS

M. Haverlag, et al., "In situ ellipsometry and reflectometry during etching of patterned surfaces: Experiments and simulations" J. Vac. Sci. Technol. B 10, No. 6, pp. 2412–2418, Nov./Dec. 1992.

"Method for Optical Interference Measurement and Control of Etching" IBM Technical Disclosure Bulletin, vol. 34, No. 10B, pp. 275–277, Mar., 1992.

*Primary Examiner*—T. Tung
*Attorney, Agent, or Firm*—H. Daniel Schnurmann

[57] ABSTRACT

Detecting the desired etch end point in the dry etching of a structure that includes a dielectric film formed onto a substrate down to a given thickness Ef. The structure is placed in the chamber of an etching equipment provided with a view-port. A light source illuminates a portion of the structure at a normal angle of incidence through the view-port. The light contains at least two specified wavelengths (L1, L2) whose value is greater than a minimum value equal to $4*N*e$ (wherein N is the index of refraction and e the thickness error of the dielectric). The reflected light is applied to spectrometers tuned to each specified wavelength, for converting the reflected light into interference signals that are processed and analyzed in a dedicated unit to generate primary signals (S1, S2). An analysis of the primary signals is performed after a predetermined delay. For each wavelength, a pre-selected extremum of the primary signal is detected and a predetermined number of extrema is counted. The counting stops when the last extremum just before Ef is reached. As a result, the distance D between the last extremum and the given thickness is now determined. The etch rate ER is also measured in-situ before the last extremum.

8 Claims, 6 Drawing Sheets

APPARATUS FOR MONITORING THE DRY ETCHING OF A DIELECTRIC FILM TO A GIVEN THICKNESS IN AN INTEGRATED CIRCUIT

FIELD OF INVENTION

The present invention relates to the manufacture of semiconductor integrated circuits and more particularly to a method and apparatus for monitoring the dry etching of a dielectric layer formed onto a substrate down to a given thickness.

BACKGROUND OF THE INVENTION

In the course of manufacturing semiconductor integrated circuits (IC), dry etching techniques, including plasma reactive ion etching (RIE), are extensively used for the removal or the patterning of layers of various materials, particularly of layers of dielectric material formed on the substrate. During the removal of such layers or films, pinpointing with accuracy the etch end point to stop etching at a given thickness is of paramount importance for process parameter control and for determining the characteristics and performance of the resulting IC. As a matter of fact, it is essential that the remaining thickness of a dielectric layer be equal or very close to the nominal value established in the product specifications. In addition, this remaining thickness must be maintained at constant from wafer to wafer. Obtaining such thickness with adequate reproducibility is a key factor to a successful completion of the processing steps to which the wafers are subsequently subjected to.

FIG. 1 is a schematic view of a portion of a wafer which consists of a semiconductor structure 10, and which essentially comprises a silicon substrate 11 and a stack 12 of insulating layers formed thereon. Typically, the stack 12 consists of a lower 30 nm thick $SiO_2$ layer 13, an intermediate 150 nm thick $Si_3N_4$ layer 14 and an upper $SiO_2$ layer 15. The interface between the lower $SiO_2$ layer 15 and the top of $Si_3N_4$ layer 14 is labelled 16a. The top surface of the $SiO_2$ layer 15 is referenced 16b. Layer 15 is generally formed by LPCVD (Low Pressure Chemical Vapor Deposition)/PECVD (Plasma Enhanced Chemical Vapor Deposition) using tetra-ethyl-ortho-silicate (TEOS) and oxygen. The substrate is provided with a shallow isolation trench 17. As such, structure 10 is a typical example of a silicon wafer after an isolation trench is formed during the fabrication of a 16 Mbit DRAM chip. At this stage, the structure 10 is planarized and the initial thickness E of the $SiO_2$ layer 15 is reduced to a predetermined value Ef, commonly defined in the product specifications. To that end, the structure 10 is coated with a layer 18 of a planarizing medium, such as a photo-resist, having broadly the same etch rate as the $SiO_2$ material. The structure 10 is etched back inside the chamber of a conventional dry etching tool. This etch back is generally completed in two processing steps, each having its own gas chemistry. During the first step of the etch back process, the structure 10 is etched until the top of the $SiO_2$ layer 15 is exposed. In the second step, which uses a more reactive gas chemistry for greater aggressiveness, the $SiO_2$ layer 15 is etched from surface 16b to a depth equal to Exf=E−Ef. The planar top surface of the remaining $SiO_2$ layer 15 after etching is referenced with numeral 16c.

FIG. 1 shows a typical structure fabricated in a manufacturing environment. It generally consists of a substrate (that includes a silicon substrate 11 upon which a layer of $SiO_2$ 13 and a layer of $Si_3N_4$ 14 are formed thereon) coated with a dielectric layer ($SiO_2$ layer 15). It requires two different optical media at the interface 16a to allow interferometric measurements and to etch the dielectric layer down to a given thickness using a dry etching tool.

The etch back process may be monitored in its totality using the well known time thickness control technique which is based on the assumption that the etch rate of the $SiO_2$ layer 15 is constant and can be determined before the etch back step of the wafer takes place. The etch rate value is determined either from the teachings obtained from the processing of a previous lot on the same tool or by processing a sample wafer of the lot under consideration inside the tool and then determining the etch rate value from this experiment. The latter is more accurate but it is time consuming and may lead to wasting an expensive wafer for each lot, such as in the case of over-etching, which is not acceptable in a manufacturing environment. According to the time monitoring technique, the etching process is stopped as soon as the final etched thickness Exf is attained. The real thickness Eyf of the remaining $SiO_2$ layer 15 is finally measured according to standard spectroscopic interferometry techniques and compared to the desired final thickness Ef. If the $SiO_2$ layer 15 is found to be over-etched, the wafer is rejected since no adjustment is possible. If the thickness Eyf is above the desired final thickness value Ef, the wafer is submitted to a new etching step in order to come closer to the desired thickness Ef. In this case, an additional etch-back and corresponding measurements are required as well.

Another well known monitoring technique is based on interferometry. This technique allows in-situ, real-time, and on-line control of the current etched thickness Ex (the current thickness of the remaining $SiO_2$ layer 15 is referenced Ey, wherein as Ey=E−Ex). During the etch back process previously mentioned, once the top of the $SiO_2$ layer 15 is exposed, the etch rate and the current etched thickness Ex can be continuously and accurately monitored. According to the standard technique, a monochromatic radiation emitted by a laser impinges the wafer incorporating the structure 10 at a normal angle of incidence. Interference fringes are formed by the radiations refracted from the top of $SiO_2$ layer 15 and at the interface 16a formed between $SiO_2$ layer 15 and the underlying layer 14 of $Si_3N_4$. An adequate detector, generally a photo-diode is illuminated by the reflected radiations and generates a signal whose intensity varies with the thickness of $SiO_2$ layer 15 to be etched. An improvement of this technique is described in European Patent No. A-0511448, of common assignee. According to this reference, a laser is no longer required, a determined radiation emitted by the plasma (in this case, the SiBr line) is observed through a top view-port by a spectrometer operating as an interferometer and through a side view-port by a second spectrometer. The signals generated by these spectrometers are processed by computer according to the claimed method described therein. This technique requires radiation of sufficient intensity to be observed. The etching process stops when Ex=Exf. The thickness of the remaining $SiO_2$ layer is thus given by Eyf=E−Exf. The true thickness Eyf of the remaining $SiO_2$ layer cannot be measured on-line and in-situ with this technique, but needs to be performed outside the dry etching tool. In addition, the plasma is a very unstable medium whose parameters can only be determined by process requirements (and thus not for monitoring), the selected radiation of a determined wavelength may reveal itself not to be optimal. Finally, the plasma is not a pin-point source. As a final result, this improved method still suffers from severe limitations.

The insulating layers cited above, particularly the $SiO_2$ layer 15 that was formed by LPCVD techniques, are known to have low reproducibility. As a result, the thickness of the deposited SiO2 layer 15 and the composition of the deposited material may significantly vary from wafer to wafer. Consequently, the thickness of the $SiO_2$ layer 15 is no longer given by its theoretical value E but must be approximated by a value equal to E±e, wherein e represents the admitted error on the thickness due to process variations during the LPCVD deposition. Typically, e is equal to about 10% of the initial thickness of the $SiO_2$ layer 15. Thus, if Exf is the final etched thickness, the final thickness of the remaining $SiO_2$ layer is given by Eyf=(E±e)-Exf. This value Eyf may differ from the desired thickness value Ef. Alternatively, the error±e relative to the original thickness E of the $SiO_2$ layer 15 is reported to the real final thickness, i.e., Eyf=Ef±e. The interferometric method thus provides an accurate and continuous measurement of etched thickness Ex (stop etching when a determined thickness Exf has been removed). Unfortunately, this is not the current thickness Ey of the $SiO_2$ layer 15 which remains on the substrate and, thus, the true final thickness Eyf at the end of the etch back operation. This results in a lack of compensation of the thickness error±e, since the true final thickness Eyf of the remaining SiO2 layer 15 that is obtained at the end of the etch process is not directly available in real time for comparison with the thickness Ef.

These considerations will be better understood by reference to FIG. 2(a) which shows a sine wave curve labelled 19a that is theoretically generated by the photo-diode of the spectrometer. In reality, due to the presence of harmonics in the signal outputted by the spectrometer, the signal is periodic but it is not sine wave shaped. In the case of normal incidence, two successive extrema (minima to maxima or conversely) which correspond to a half-period are separated by a distance d according to the relation d=L/4*N, wherein L is the wavelength and N the refraction index of the $SiO_2$ layer 15. In turn, the etch rate ER and the etched thickness during the half-period is correlated by the equation ER=2*d/T, wherein T is the period of the periodic signal. Because of the thickness error e due to the process variations mentioned above, the current thickness Ey will depend on the real thickness value of the $SiO_2$ layer 15 (i.e., E±e), as illustrated in FIG. 2(a). Curve 19a passes through a maximum at interface 16a. Process variations thus lead to an error while determining Ey which results in stopping the etching process at a final thickness value Eyf of the remaining $SiO_2$ layer 15 which may be significantly different from the desired thickness Ef.

Additionally, differences in composition exist in the deposited materials forming the various layers of stack 12 mentioned above with respect to the expected compositions. In particular, this results in slight differences in the nominal refraction index N of the $SiO_2$ layer 15 and, more generally, of the refraction index of all the other layers forming stack 12. Moreover, other layers may also have a variable thickness with regard to their respective nominal thickness, producing significant topographical differences. Finally, differences between product wafers within a lot are a major source of concern. These differences generally result from process variations that are inherent to any semiconductor devices manufacturing technology. The sine wave curve 19a of FIG. 2(a) is illustrative of a perfect adaptation of a wavelength L of the monochromatic radiation with the nominal refractive index N of the $SiO_2$ layer 15 and, more generally, of the optical characteristics of stack 12. As far as the structure 10 of FIG. 1 is concerned, the true value of the refractive index is given by N±n, with N=1.48 and the error n=0.002, i.e., the true value of N varying between about 1.46 and about 1.50. As soon as a discrepancy occurs between the selected wavelength and the refractive index, a degradation in the signal outputted by the spectrometer ensues, as illustrated by curve 19b of FIG. 2(b). In this case, monitoring the dry etch process to detect the etch end point is no longer possible.

The typical value of the thickness E of $SiO_2$ layer 15 is thus equal to 650±65 nm. This value is compared with the desired thickness of the layer 15 remaining after the planarization step, given in this instance by Ef=100±5 nm. As a result, the error e=65 nm related to the nominal thickness E=650 nm of the $SiO_2$ layer 15 is related to the thickness of the remaining $SiO_2$ layer 15 in its totality, while the thickness error on the remaining $SiO_2$ layer 15 that is sought should be equal to or be less than 5 nm. It is important that the thickness error e=65 nm be of the same order of magnitude than the thickness Ef=100 nm of the remaining $SiO_2$ layer 15. A major problem is thus to eliminate the thickness error e and the refraction index error n.

SUMMARY OF THE PRESENT INVENTION

The present invention aims at monitoring the dry etching process of a structure comprising a dielectric film formed onto a substrate. The main object is to etch the dielectric film (e.g. the $SiO_2$ layer 15 in FIG. 1) whose nominal thickness E is subject to an error e down to a given thickness Ef measured from the interface between the bottom of said dielectric film and the substrate. The thickness is accurately defined in the product specifications.

Another object is to eliminate the error n on the nominal refractive index N and, more generally, of the optical characteristic dispersion within the stack 12. Typically, the substrate is part of a semiconductor wafer and consists of silicon coated with a layer of insulating material (e.g., the composite $SiO_2$ 13/$Si_3N_4$ 14 layer shown in FIG. 1).

In a preferred embodiment, a primary innovation consists in the use of a multi-wavelength light source, such as a mercury lamp, that generates a light containing at least two radiations having specified wavelengths. These wavelengths L1 and L2 are greater than a minimum wavelength Lmin, wherein Lmin=4*N*e. This light illuminates a large portion of the wafer that is placed inside a dry etching tool at substantially a normal angle of incidence (via an optical fiber and a collector lens). The reflected light is applied to two spectrometers, each being adapted to process one radiation. The analog signals that are outputted from the spectrometers are illustrative of the interferences in the reflected light. These signals are converted to digital signals in respective A/D converters, and applied to a digital computer for signal processing and analysis. The computer processes the signals to generate filtered and normalized primary signals S1 and S2, and their respective derivative signals S'1 and S'2, using numeric filtering thereof. It is recommended to have a phase shift (e.g., a quarter of period) therebetween.

According to a preferred method of the present invention, the parameters that specify the etch end point and determine the etch end point criteria are first determined. The nominal thickness E of the dielectric film makes it possible to determine the number of periods of the primary signal S (S meaning either S1 or S2) between the top of the dielectric film and the film/substrate interface. Experiments show that primary signal S has an extremum (e.g., a minimum or a maximum) at the film/substrate interface. Next, the given thickness Ef is also converted in terms of periods. It is thus possible to identify the furthest extremum signal S that can be achieved prior to attaining the given thickness Ef. The furthest extremum is at a full-period (or a multiple thereof) distance from the interface. A delay must be reserved to perform certain selection tests and measurements before the last extremum is attained. On the other hand, it is also required not to initiate any signal processing before the numeric filters are stabilized. Now, an extremum on the curve can be selected in the authorized period which reserves these delays. The time that is required to travel from the top of the dielectric film and the selected extremum is referred to as the RATE TIME RT (RT meaning either RT1 or RT2). The RATE TIME RT is thus a "time disregarding period" which takes into account all these timing requirements. The number X (X meaning either X1 or X2) of zeroes between this selected extremum (not included) and the furthest extremum can thus be determined. The manner how the primary signal S reaches the selected extremum (in an up-going or down-going transition) is also identified and is represented by a sign A (A meaning either A1 or A2). The remaining thickness D (D meaning either D1 or D2) which corresponds to the distance between the furthest extremum and the given thickness can be easily determined. One can now define a STOP THICKNESS parameter ST (ST meaning either ST1 or ST2) represented by AXD. The etch stop is accurately defined by the etch end point criteria comprised of RT and ST and by the etch rate which is measured in-situ and on-line for the wafer being etched. The RATE TIME and STOP THICKNESS parameters may be determined either by computations (at least for a coarse approximation) or by processing a wafer (a sample or an ideal product wafer) in a preliminary run. The etch end point criteria are inputted in the computer.

The product wafers are then processed under the control of the computer. First, the computer waits for the "time disregarding period" (corresponding to RT) before analyzing the primary signal S. Once this period of time has elapsed, it identifies the selected extremum and counts the number X of 0's to detect the last extremum. During this time, it also proceeds to select tests to determine which wavelength is the most adequate. It then makes measurements to determine the etch rate ER (ER meaning either ER1 or ER2). These operations are performed for each of the primary signals S1 and S2. Before the earliest of the two last extrema is reached, the computer selects the best primary signal S1 or S2 as the result of the selection tests mentioned above. Finally, it determines the remaining etching time dt to travel from the last extremum of the selected primary signal to the given thickness. This time dt is given by dt=D/ER. In fact, while searching for the extrema of primary signals S1 and S2, the selection tests and the measurements mentioned above are preferably conducted on the derivative signal S'1 and S'2 for best accuracy.

If the technology ensures that no (or a negligible) refractive index dispersions in the dielectric film exist, or if a dedicated monitoring site is used, then, in a second preferred embodiment, only one wavelength (and thus one spectrometer) that generates a single primary signal S and a small size light beam can be envisioned.

The method of the present invention of monitoring the dry etching of a dielectric film down to a given thickness thus significantly departs from the known interferometric monitoring techniques described above, wherein the etched thickness is measured from an imprecise origin, i.e., from the top of the dielectric film. According to the present method, the monitoring is performed from the dielectric film/substrate interface to stop etching when the desired thickness is reached. In addition, at least two wavelengths are used, instead of using one wavelength radiation (that could generate poor interference signals in case of incompatibilities with the refractive index of the dielectric film). Problems which result in variations in the nominal thickness and refractive index of the dielectric film that are inherent to the manufacturing process can now be overcome. Therefore, according to the present invention, the dry etching of the dielectric film down to a given thickness is performed with great accuracy and reproducibility. The method of the present invention finds a wide range of applications and technical domains, not only in the planarization of layers, as illustrated above by reference to FIG. 1, but more generally in the polishing of a dielectric film down to a given thickness.

OBJECTS OF THE INVENTION

It is therefore a primary object of the present invention to monitor the dry etching process of a dielectric film formed on a substrate down to the desired thickness (referred to as the given thickness) of the dielectric film that remains on the substrate.

It is another object to monitor the dry etching process of a dielectric film formed on a substrate down to the desired thickness, wherein the etch end point criteria are determined from the dielectric film/substrate interface and not from the top of the dielectric film, as practiced in the art.

It is another object to monitor the dry etching process of a dielectric film formed on a substrate down to the desired thickness with great accuracy and full reproducibility for all wafers of a lot.

It is still another object to monitor the dry etching process of a dielectric film formed on a substrate down to the desired thickness that is independent from film thickness and variations in composition due to the manufacturing process.

It is still another object to monitor the dry etching process of a dielectric film formed on a substrate down to the desired thickness that is based upon the use of a large light beam that include at least two radiations having different and specified wavelengths and the selection of the best one.

It is still another object to monitor the dry etching process of a dielectric film formed on a substrate down to the desired thickness wherein the specified wavelengths are greater than a minimum value given by 4*e*N (e being the thickness error and N, the refractive index of the dielectric film).

It is still another object to monitor the dry etching process of a dielectric film formed on a substrate down to the desired thickness that is based upon the use of a small light beam a specified wavelength that is greater than a minimum value given by 4*e*N.

It is still another object to monitor the dry etching process of a dielectric film formed on a substrate down to the desired thickness wherein the etch rate is measured in-situ and on-line for the product being etched for maximum accuracy.

BRIEF DESCRIPTION OF THE DRAWINGS

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings, in which:

DESCRIPTION OF THE PREFERRED EMBODIMENTS

Description of the System

Figure 3:
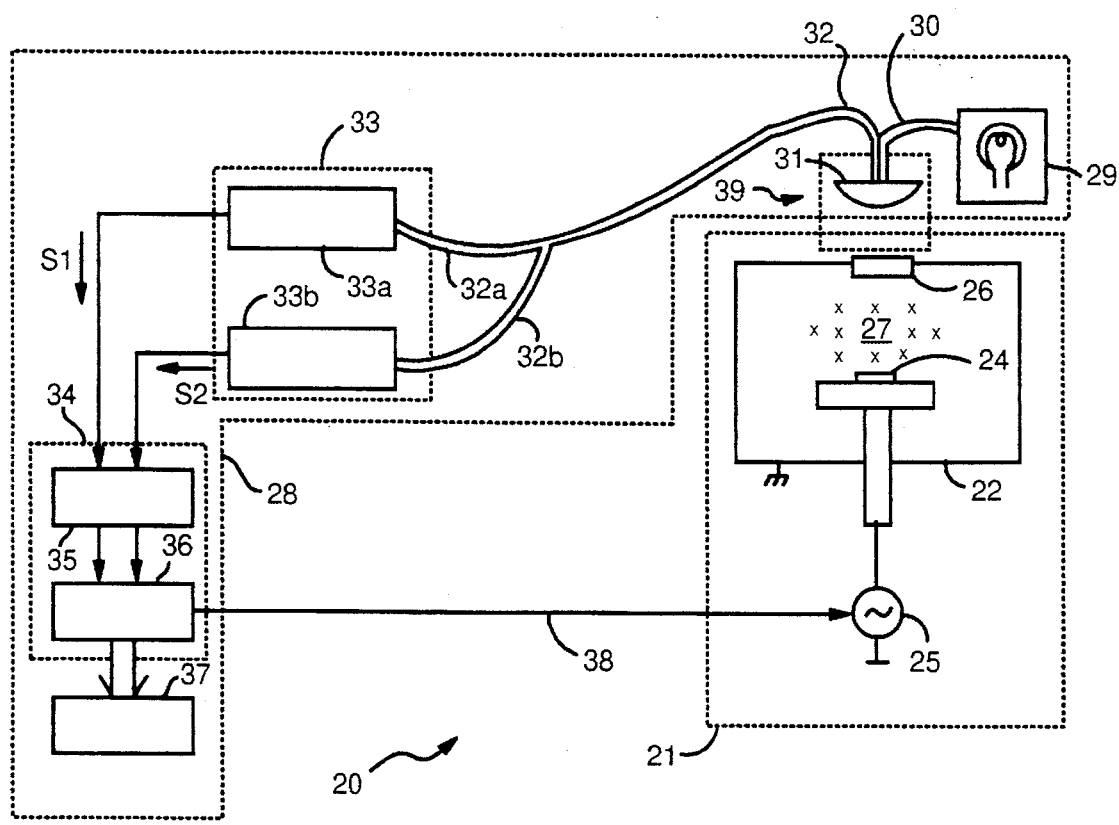
FIG. 3 is a schematic view of the apparatus of the present invention which includes a polychromatic mercury lamp that illuminates a large area of the wafer at a normal angle of incidence and two spectrometers, each being adapted to a specified wavelength, to generate corresponding interference signals.

Referring to FIG. 3, there is shown an etching and a monitoring system 20 that is adapted to carry out the method of the present invention. System 20 includes dry etching equipment 21 which consists of an etch-treatment chamber 22 enclosing a planar-shaped susceptor 23 that holds the wafer 24 to be processed, and the RF power supply source 25. According to the teachings of the present invention, it is essential the etch-treatment chamber 22 be provided with at least one window or (view-port) 26 made of material that is transparent for the wavelengths used, so that the wafer 24 can be illuminated. For several reasons, a normal angle of incidence is preferred. With the particular implementation shown in FIG. 3, the view-port 26 is located at the top wall of chamber 22. An appropriate etching equipment in that respect is the AME precision 5000 commercially available from APPLIED MATERIALS INC, Santa Clara, Calif., an RIE tool which includes a plurality of single wafer plasma etch reactors. With this type of tool, susceptor 23 is the cathode and the chamber wall forms the other electrode which is connected to the ground. The plasma 27 generated between the two electrodes contains species that are representative of the etching conditions. While etching is performed, the emission from these species changes in intensity as a function of time, etched material and surface modifications.

System 20 further comprises the monitoring apparatus 28 of the present invention. A light source 29 illuminates the wafer through top view-port 26 via an optical cable 30 and a collector lens 31. According to the teachings of the present invention, to eliminate possible optical characteristic dispersions in stack 12 between the product wafers due to process variations, at least two specified wavelengths L1 and L2 are recommended. In that respect, different practical implementations of the light source 29 can be envisioned, e.g., either white light sources (such as, xenon or halogen lamps) or polychromatic light sources (such as, low pressure mercury (Hg) or argon (Ar) lamps). Preferably, light source 29 is a low pressure mercury pen ray, such as model 90-0020-01 sold by UVP, San Gabriel, Calif., which delivers eight radiations with wavelengths in the 254–579 nm range. The combination of two monochromatic lasers such as model 1108P sold by UNIPHASE, Manteca, Calif., (each tuned to generate one of two specified wavelengths) or mixed lamp/laser solutions are adequate as well. The choice of a mercury lamp to fit external light source 29 is preferred for the following reasons: first, it offers a wide choice of wavelengths; secondly it is a stable source of light whose intensity may be adjusted independently of the plasma conditions and, finally, of its low cost and with reduced dimensions which are advantageous when compared to a laser having short wavelengths. Optical cable 30 includes a plurality of elementary optical fibers adapted to transport light. Light reflected back from the surface of wafer 24 is detected by optical cable 32 which includes optical cables 32A and 32B, as illustrated in FIG. 3, having the same construction as optical cable 30. The elementary optical fibers forming optical cables 30 and 32 are arranged to display the same optical axis perpendicular to the wafer 24. In a particular implementation, they are assembled close together and randomly to form a single bundle of fibers. Optical cables 30 and 32 are constructed from fibers forming the bundle, as is the case for optical cables 32A and 32B that form optical cable 32. However, a set of three different optical cables 30, 32A and 32B would do just as well. Optical cables 30 and 32 view the wafer 24 at a normal angle of incidence. Lens 31 provides a parallel light beam through top view-port 26. Each optical cable must provide a solid angle that allows illumination/capture of the emitted/reflected light from a relatively large area of the wafer 24. Optical cables 32A and 32B are respectively connected to spectrometers 33A and 33B. One such spectrometers is the model known by the trade name DIGISEM that is commercially available from SOFIE INST., of Arpajon, France. This model is tunable over a wide-range spectrum of radiations and, in the present case, to the wavelength of the polychromatic light emitted by mercury lamp 29. Each spectrometer comprises a monochromator and a detector. The transmitted light is received by the motor driven monochromator which filters all radiation wavelengths, except the one to be monitored. The selected radiation is then received by the detector. The detector may be either a low-noise diode detector or, preferably, a low noise photomultiplier tube combined with an analog filter and an amplifier. Analog interference signals that are outputted by the amplifying sections of spectrometers 33A and 33B, respectively, are applied to a processing/analyzing unit 34 comprised of an unit 35 including two I/V converters, anti-alaising (low frequency) filters, two A/D converters and buffers, and a processing/analyzing unit 36, such as a software operated digital computer. Finally, computer 36 generates primary signals S1 and S2 which are representative of the analog interference signals and respective derivative signals S'1 and S'2 obtained by numeric filtering. A printer 37 (or a chart recorder unit or a plotter or a visual display) is connected to the computer. Printer 37 allows the printing of analog signals that are generated according to the present monitoring method. Finally, computer 36 monitors the operation of the etch chamber 22 through control line 38, which is connected to the RF frequency power supply source 25 via a remote control unit. This line 38 allows automatic switch-off of the etching process at end-point detection when the desired given thickness Ef has been attained. Note that only one spectrometer 33 could be used, should an advanced spectrometer such as model SDA sold by SOFIE INSTR., of Arpajon, France be used. This type of spectrometer is provided with a multi-channel photo-diode array.

Figure 4:
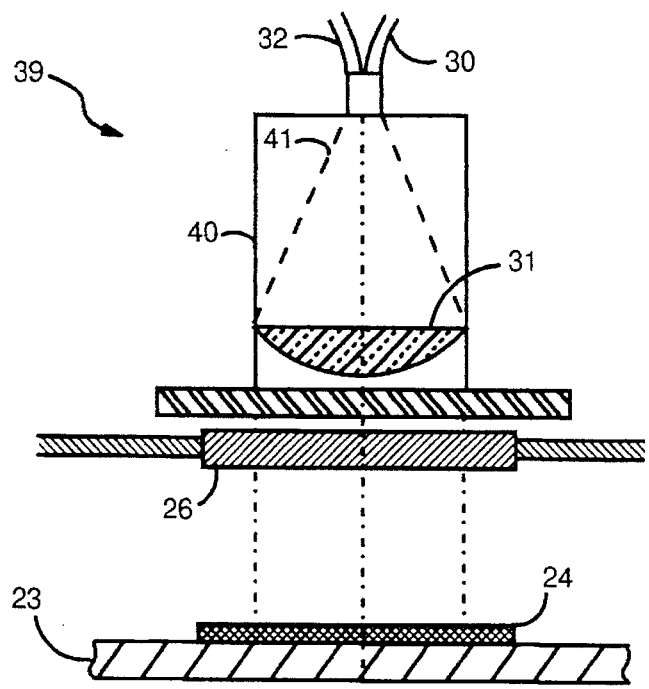
FIG. 4 shows an enlarged view of the collimation section of the apparatus of FIG. 3.

FIG. 4 shows a detailed view of the collimator section referenced 39 which consists of a housing 40 which encloses a collector lens 31. Housing 40 has a transparent bottom facing the top view-port 26 and is adapted to receive optical cables 30 and 32 which are connected to its top. The shape of the light beam that is directed onto the sample wafer (via optical cable 30) and reflected therefrom (via optical cable 32) is referenced 41 in FIG. 4. As illustrated in FIG. 4, a large area of wafer 24 is illuminated.

Description of the Method of the Present Invention

Prior to etching the wafers, several preliminary steps for calibrating the system 20 of these wafers may be required. It is essential that at least one adequate wavelength be selected and that the etch end point criteria be determined. The wavelength and criteria must be adapted to the product wafers in consideration. In the following description, reference will be made to two wavelengths to eliminate the thickness error and the refractive index differences previously mentioned.

Calibrating System 20

A) Selection of wavelengths L1 and L2

The criteria for selecting adequate wavelengths will now be described. The selection, in turn, determines the choice of an adequate mercury lamp 29. The wavelengths are extracted from data that can be found in the product specifications. Indeed, in a product wafer, the real thickness of the $SiO_2$ layer 15 is given by E±e, where e is the film thickness error and its real refractive index is given by N±n, where n is the refractive index error. The refractive index error n is a major source of optical characteristic dispersion caused by thickness and differences in composition in all the layers forming stack 12. The errors e and n result from the process variations from wafer to wafer previously mentioned. In our example, E=650 nm, e=65 nm (assuming e to be 10%), N=about 1.48 and n=about 0.02. The selected wavelengths L1 and L2 must be adapted to the particular refractive index N of the $SiO_2$ layer 15, and more generally, to the optical properties of stack 12. The $SiO_2$ layer 15 must be transparent to both wavelengths. However, it is essential that the selected wavelengths L1 and L2 be greater than a theoretical minimum Lmin=4*N*e, i.e., L1>Lmin and L2>Lmin. This choice is particularly important to eliminate optical path dispersions from one wafer to the next or from the wafers of one lot to another. In the following description, it is assumed that L2>L1. Furthermore, it is desirable to have the lowest possible values for L1 and L2 to get maximum accuracy. Additionally, it is required that the corresponding primary signals S1 and S2 display a different behavior, at least in the period of time where some selection tests and measurements (to be described in more details hereinafter) are made on the product wafer. Particularly, if wavelengths L1 and L2 are selected to be different but relatively close of one another, it is recommended to introduce a desired phase shift between signals S1 and S2, typically, of the order of a quarter of a period. Finally, combining these criteria efficiently prevents any subsequent distortion of signals S1 and S2 caused by parasitic reflections due to topology and optical properties of stack 12. By way of example, if e=65 nm and an average value of N=1.48, it results that Lmin=385 nm. The mercury lamp mentioned above which contains discrete wavelengths in the 254–579 nm range is therefore adequate since the closest wavelengths just above Lmin are L1=404.7 nm and L2=435.8 nm. These values meet the above criteria. If there were no admitted error on the refractive index N of the $SiO_2$ layer 15 and more generally, no dispersions of the stack 12 optical properties because of the technology used, only one wavelength could be used. Likewise, the monitoring method of the present invention could be implemented with one wavelength if it was applied to a specific dedicated site of the product wafer. However, this approach is not appealing in a manufacturing environment.

B) Determining an etch end point criteria

Figure 1:
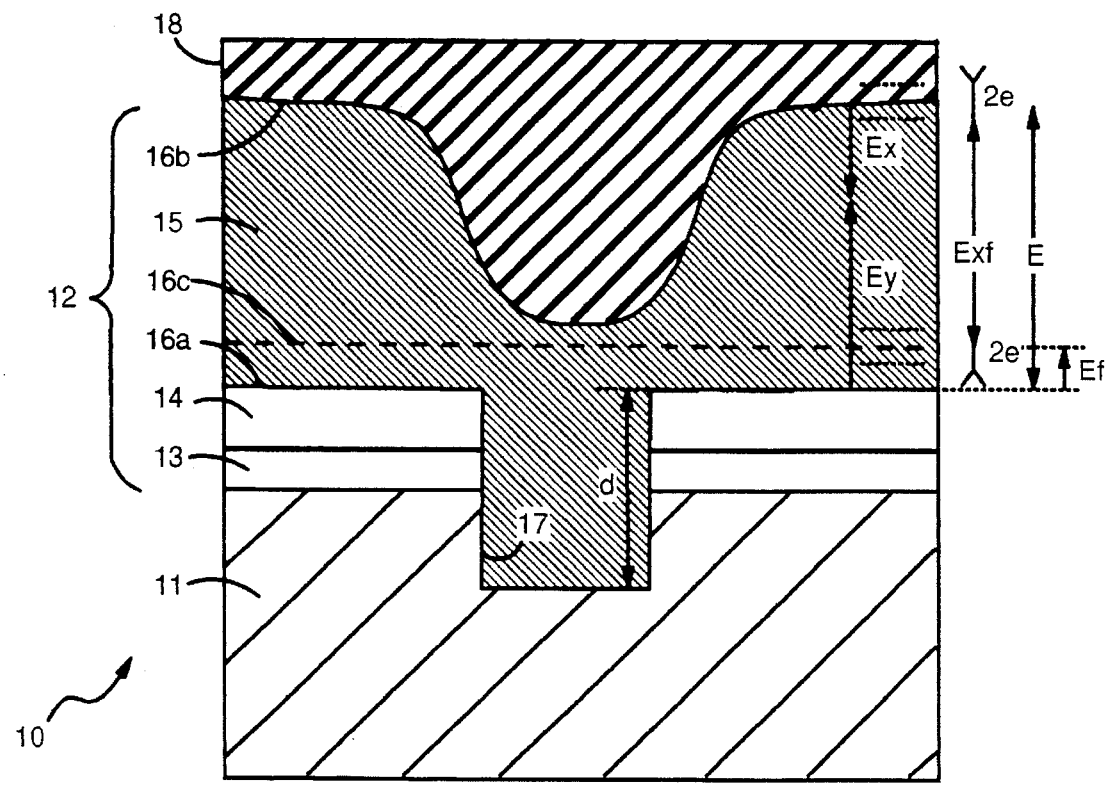
FIG. 1 shows a schematic view of a silicon structure provided with an isolation trench at the step of planarizing a dielectric film (TEOS SiO$_2$) whose thickness is subject to an error e down to a given depth to illustrate the resulting inherent error e on the thickness of the remaining layer when standard time based or interferometric techniques are used.
Figure 2:
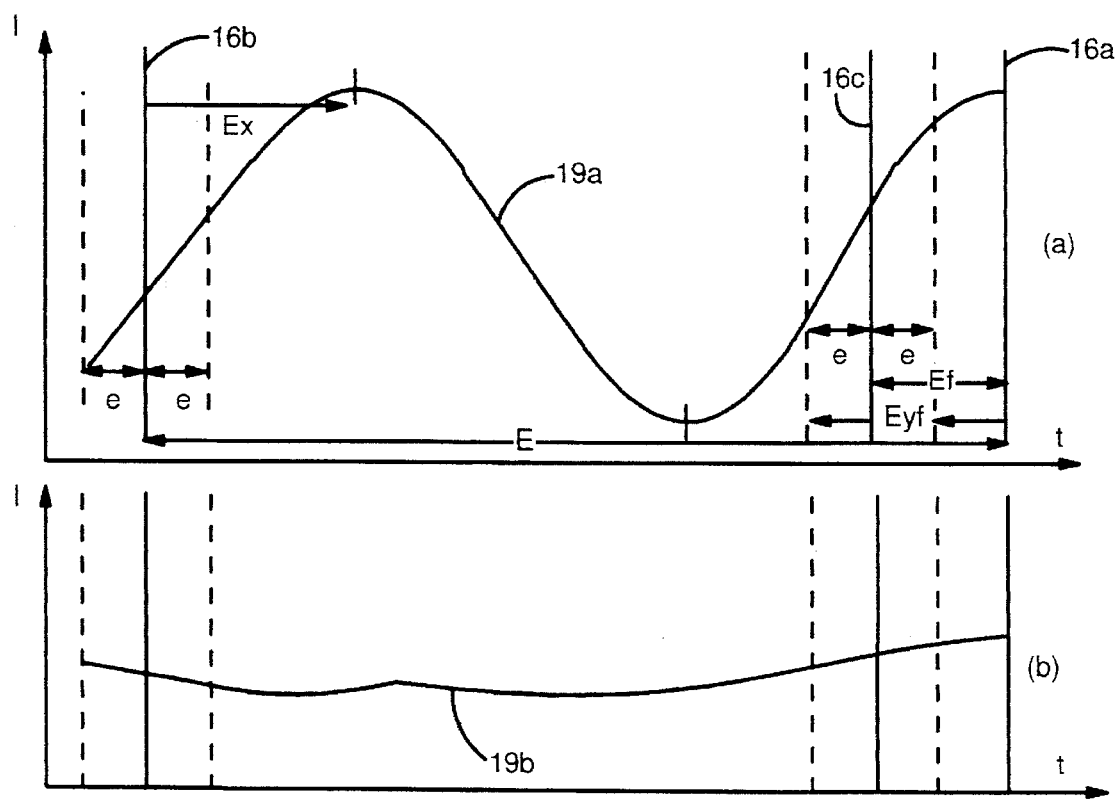
FIGS. 2(a)–2(b) respectively show the interference signal which is obtained from the interferometer when the refractive index of the dielectric film is or is not well adapted to the selected wavelength.

For convenience, in the following description, determining the etch end point criteria will be made by reference to the graphs depicting the primary signals S1 and S2. These graphs can be obtained through theoretical computations based on product specifications. They can also be obtained by etching a product or a sample wafer (that is provided with the stack structure of FIG. 1). Sample wafers are extensively used for characterization purposes. The sample wafer can be etched until the top of the $Si_3N_4$ layer 14 is exposed, so that the totality of the interference curves representing signals S1 and S2 is obtained. These techniques provide the operator or the computer with a coarse approximation on the behavior of the system 20. The system 20 can also be calibrated with a product wafer, either an ideal product wafer (i.e., a wafer whose $SiO_2$ layer thickness equals the nominal value, i.e., E=650 nm) to be referred herein as sample or product wafer. In the latter case, for an expensive wafer, it is recommended to stop etching before the estimated etch end point is reached, to measure the remaining thickness to be etched (in order to determine the etch end point criteria) and finally to complete the etching process. In this instance, the etching is conducted according to the time thickness control technique mentioned above. The use of an inexpensive sample wafer has obvious cost advantages over the use of a product wafer but it may behave differently because of topographical differences. The most advantageous solution appears to be a combination of a coarse determination of the etch end point criteria by theoretical computations and to the use of a product wafer which was positioned in the middle of the carrier during the previous TEOS $SiO_2$ deposition step for fine adjustment thereof. Once adjusted that way, the remaining product wafers of the lot can be processed without special care. As a result, a costly product wafer used to terminate the calibration of system 20 will not be wasted.

Determining the etch end point criteria will be described hereinafter with reference to the etching of a sample wafer.

First, the sample wafer is placed inside the RIE tool 21. A beam of light that includes two radiations of wavelengths L1 and L2 is generated by mercury lamp 29 and coupled to the top view port 26 to illuminate the wafer. The reflected light beam which results from wafer illumination is applied to spectrometers 33A and 33B via optical cables 32A and 32B. The processing unit 34 and the printer 37 are turned on. The system 20 is now ready for operation.

As soon as the etch process and the monitoring have been started, spectrometers 33A and 33B, respectively, generate analog interference signals S1 and S2 that are illustrative of the intensity of the reflected light, as a function of the elapsed time for their respective radiation. After conversion to digital form and filtering, signals S1 and S2, are filtered through numeric filters to generate, respectively, derivative signals S'1 and S'2. Derivative signals S'1 and S'2 are obtained by numeric filtering of signals S1 and S2 (using a mathematical algorithm for harmonic elimination, as known to those skilled in the art). The purpose of this signal processing is to generate a derivative signal that crosses an arbitrary X axis when the corresponding primary signal crosses an extremum. Processing the zeroes of the derivative signals is more accurate than processing extrema of the primary signals, because of abrupt transients thereof. In the present case, the numeric filtering that has been implemented broadly operates like a derivation of the primary signal.

Figure 5A:
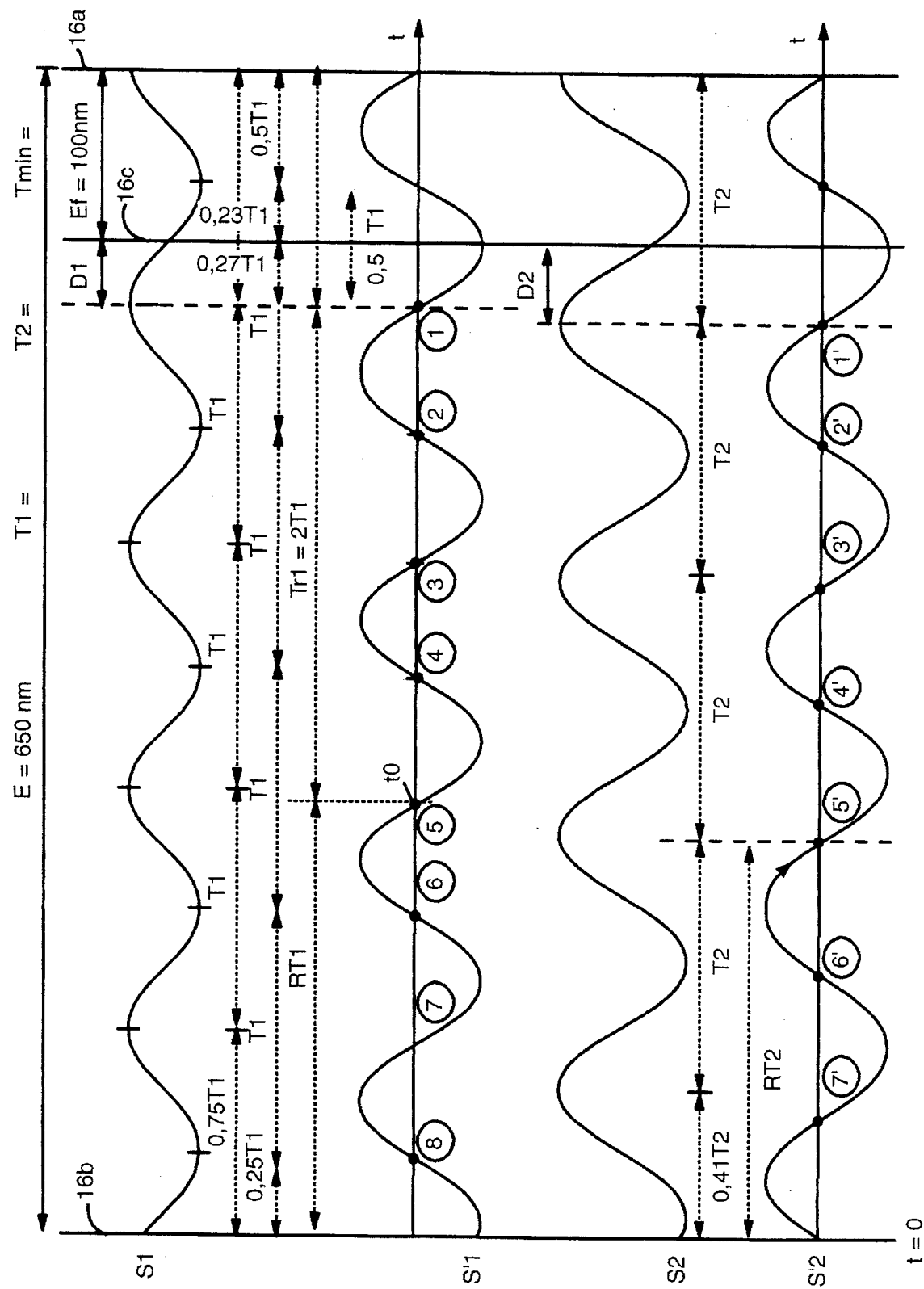
FIG. 5A shows a schematic representation of the waveforms of signals S1 and S2 that are obtained for a sample wafer (an ideal product wafer) at the output of the spectrometers for each selected wavelengths L1 and L2 and the signals S'1 and S'2 that are respectively derived therefrom by numeric filtering.

Determining the two main parameters of the monitoring method of the present invention, i.e., the STOP THICKNESS ST and the RATE TIME RT for each wavelength L1 and L2 preferably requires plotting the graphs of the primary and derivative signals. FIG. 5A shows an idealized graph representing the waveforms of primary signals S1 and S2, and the derivative signals S'1 and S'2 that have been obtained for the sample wafer under consideration. Similar schematic plots would have been obtained from the theoretical computations mentioned above. For sake of clarity, in FIG. 5A, the various surfaces/interfaces described above by reference to FIG. 1 are shown.

The STOP THICKNESS and the RATE TIME parameters constitute the etch end point criteria that are essential to the implementation of the monitoring method of the present invention, and which will be discussed hereinafter in greater detail.

The STOP THICKNESS Parameter

According to a principle of the present invention, the etch end point is not determined from the TEOS surface 16b as practiced in prior art techniques described above, but from the TEOS $SiO_2/Si_3N_4$ interface 16a. In particular, the STOP THICKNESS parameter ST is first based on finding the interference curve of a primary signal S (S meaning either S1 or S2) maximum at the TEOS $SiO_2/Si_3N_4$ interface 16a, as shown in FIG. 5A. Consequently, if one considers that the nominal thickness E of the initial $SiO_2$ layer 15 and the final desired thickness Ef thereof which remain at the end of the etching process have a definite value, the shape and the number of periods T (T means either T1 or T2) of signal S is identical at a given distance from interface 16a, regardless of the wafer and the thickness error e due to process variations. In addition, because of the particular choice made for the selected wavelength L (L meaning either L1 or L2), surface 16c which corresponds to the given thickness Ef will be located between two consecutive extrema of the primary signal S or two zeroes of the derivative signal S' (S' meaning either S'1 or S'2), i.e., a half-period. The last extremum is thus located at a distance from interface 16a corresponding to a full period T (FIG. 5A) or, more generally, to a multiple thereof. There is thus a last zero of the curve S' corresponding to the last extremum located at a determined distance D (D meaning either D1 or D2) from the surface 16c. In summary, the number of times this primary signal S crosses an extremum between surfaces 16a and 16c is precisely determined. Practically, it is performed by counting the number of zero crossings of the derivative signals S' until surface 16c is reached.

For the sample wafer, the nominal thickness E allows computation of the theoretical number of periods K1(1) between surface 16b and interface 16a for primary signal S1. This number is such that K1(1)=(2*N*E)/L1= (2*1.48* 650)/404.7=4.75 T1 (the period of signal S1). As apparent from FIG. 5A, this number K1(1) represents the sum of half-period between interface 16a (at a maximum) and the first minimum (from interface 16a), the next four intermediate full periods and finally a quarter-period, before reaching surface 16b. On other hand, the value of the thickness of the TEOS layer 15 which remains at the end of the etch process, illustrated by surface 16c, is known and is equal to Ef. In turn, this value can be converted to a fraction of period T1. In the instance where Ef=100 nm, this number K1(2) is given by K1(2)=(2*N*Ef)/L1=(2*1.48*100)/404.7=0.73 T1. This value is the sum of 0.5 T1 (between the two extrema mentioned above) and 0.23 T1. Finally, the number of zeroes between surfaces 16b and 16c (still for the nominal thickness E), is determined from K1(1)−K1(2)=4.02 T1= (8*½+0.02) T1, so that K1(3), the integer number of zeroes, is given by K1(3)=8. These zeroes are labelled by a number ranging from 1 to 8, and are shown encircled in FIG. 5A. As far as signals S2 and S'2 are concerned, corresponding numbers K2(1) and K2(2) may be established. We have K2(1)=(2*N*E)/L2=4.41 T2 (T2 is the period of signal S2), K2(2)=(2*N*Ef)/L2=0.68 T2 and K2(1)−K2(2)=3.73 T2, so that K2(3)=7. These zeroes are labelled by an encircled number that ranges from 1' to 7' (FIG. 5A).

According to the monitoring method of the present invention, counting of zeroes starts after a certain delay following the beginning of the etch process. This delay, referred to as the RATE TIME RT (RT meaning either RT1 or RT2), is determined by several experiments that are conducted on the sample wafer. The rate time RT is the "time disregarding period" which takes into account the time to perform the necessary operations during wafer etching, essentially the tests for selecting the best primary signal (with the most adequate wavelength) and measuring the etch rate ER and, secondly, the time to initialize the numeric filters and to normalize the primary signals S1 and S2. The method for determining the rate time RT will be described hereinafter in more detail.

Referring to FIG. 5A wherein the last zero in curve S'1 is labelled (1), let it be assumed that the rate RT1 for signals S1 and S'1 corresponds to the zero labelled (5) at elapsed time t0. As apparent from FIG. 5A, the number X1 of zeroes between the zero labelled (5) (not included in the count) and the last zero labelled (1) equals 4. X1 is the first component of the ST1 parameter. Similar reasoning applies to signals S2 and S'2, so that X2 is also found to be equal to 4 (assuming a rate RT2 shown in FIG. 5A to correspond to the zero labelled (5')). As apparent from FIG. 5A, the rate RT2 for signals S2 and S'2 is different from rate RT1, and there is a non-negligible periodicity difference between primary signals S1 and S2, particularly, in the active area for a duration Tr (Tr meaning either Tr1 or Tr2) of about two periods T.

The second component of parameter ST is the distance D (D meaning either D1 or D2) between the last extremum of primary signal S and surface 16c. The distance which corresponds to one period T is equal to L/2*N. Distance D is then easily derived from the relation D=L/2*N−Ef. Still using the above figures, D1=404.7/(2*1.48)−100=37 nm and D2=435.8/(2*1.48)−100=47 nm.

Finally, the third component, referred to by letter A, is related how the zero crossing of the derivative signal S' after the rate RT has elapsed takes place, i.e., depending if it is from an upward or a downward transition. As apparent from FIG. 5A, the zero labelled (5) of signal S'1 is reached by a downward transition. It is worthwhile to introduce this component in the ST parameter, for full description thereof. In the first case (downward transition), A is represented by a first value or sign, (e.g. A=+), and by a second value or sign, (e.g., A=−) in the appropriate case.

Therefore, most generally, the STOP THICKNESS parameter ST is represented by the word A X D (D given in nms). The STOP THICKNESS parameter ST is established for each wavelength L1 and L2. With the experiments described hereinabove by reference to the sample wafer, illustrated in FIG. 5A, the respective STOP THICKNESS parameters ST1 and ST2 for each wavelength, are thus represented by ST1=+4 37 and ST2=+4 47. Since in this case, the two wavelengths L1 and L2 (and thus, the corresponding periods T1 and T2) are slightly different, X1 and X2 have equal values (X1=X2=4), although the distance components D1 and D2 are different.

The RATE TIME Parameter

Numeric filtering requires a determined delay before the numeric filters are stabilized and the primary signals normalized to provide reliable results adapted to a manufacturing environment. Alternatively, a finite time is required to proceed to the necessary steps of testing the primary signals S1 and S2 to determine the best and, thus, which wavelength is to be selected for monitoring the etch process. Simultaneously, several other measurements are conducted to determine the average etch rate ER that is necessary to calculate the remaining time of etching when the last maximum has been reached. It is important to notice that the etch rate ER measurement is very accurate because it is conducted on-line and in-situ, so that it perfectly corresponds to the real etching condition of the wafer (sample or product) undergoing etching. All these delays take into consideration the RATE TIME RT parameter, another essential parameter of the present invention. The basic rules to be used for the RATE TIME RT determination shall now be described.

Determining the RATE TIME RT first requires to estimate the time that is necessary to proceed to certain selection tests and measurements. From previous experiments, it has been demonstrated that although one test over a half period is sufficient to determine the best primary signal S1 or S2 (and thus which wavelength is the most adequate) to measure the etch rate, it seems that the optimum number of selection tests is about two. In this case, the total test period is equal to a full period T. However, if there are no special time constraints, more tests can be made for greater accuracy. The method will be described by reference to signals S1 and S'1 illustrated in FIG. 5A. If the last zero (1) of signal S'1 is excluded for practical reasons, it follows that zeroes (2), (3) and (4) are required for the selection tests. This time being reserved, the first zero now available is the zero labelled (5), which corresponds to a duration Tr1 equal to two periods T1 necessary to reach the zero labelled (1). This duration Tr1 appears sufficient to proceed to the measurements that are necessary to determine the etch rate ER1. As a result, still for this sample wafer, and only as far as the selection tests and etch rate measurements are concerned, an adequate RATE TIME RT1 would be 4.75 T1-3 T1=1.75 T1. Starting from surface 16b with a nominal thickness E, the time to that is necessary to reserve this delay RT1 is given by RT1= (1.75*L1*60)/(140*2*N)=103 sec (assuming an average etch rate ER1=140 nm, an estimated value or the average value measured on a preceding lot of wafers). It just remains now to check that this delay RT1 is adequate to have the numeric filters stabilized and primary signals normalized. It has been shown that the stabilization time is substantially less than half-period T1, i.e., about 30 sec in the described example of FIG. 5A. Note that zeroes labelled (6) and (7) instead of (5) could have been used just as well with regard to the test/measurement time Tr1, if the above mentioned conditions to stabilize the filters and normalize the signals are to be met. A similar reasoning also applies to determining RATE TIME RT2. The RATE TIME RT is thus a time period that corresponds to the time interval required for the derivative signal S' to travel from surface 16b to the selected zero thereof, in an upward or a downward transition.

The ST and RT parameters are inputted in the computer 36 to meet the etch end point criteria of the product wafers to be subsequently etched. Etching of the sample wafer is stopped as soon as the etch end point is reached and the sample wafer is removed from the etching equipment 21. The remaining thickness of the TEOS layer 15 is measured and the STOP THICKNESS ST parameter adjusted, if so required. System 20 is now calibrated and ready for processing the remaining product wafers of the lot. For each product wafer, the computer determines the etch end point using the ST parameter and knowing the delay, referred to as the "time disregarding period" t0 (=RT), that it must wait before initiating the signal processing. After this "time disregarding period" has elapsed, numeric filtering takes effect, the primary signals are normalized and the computer analyzes the primary signal S1 and S2, as mentioned above.

C) Monitoring the etch process of a product wafer

Figure 5B:
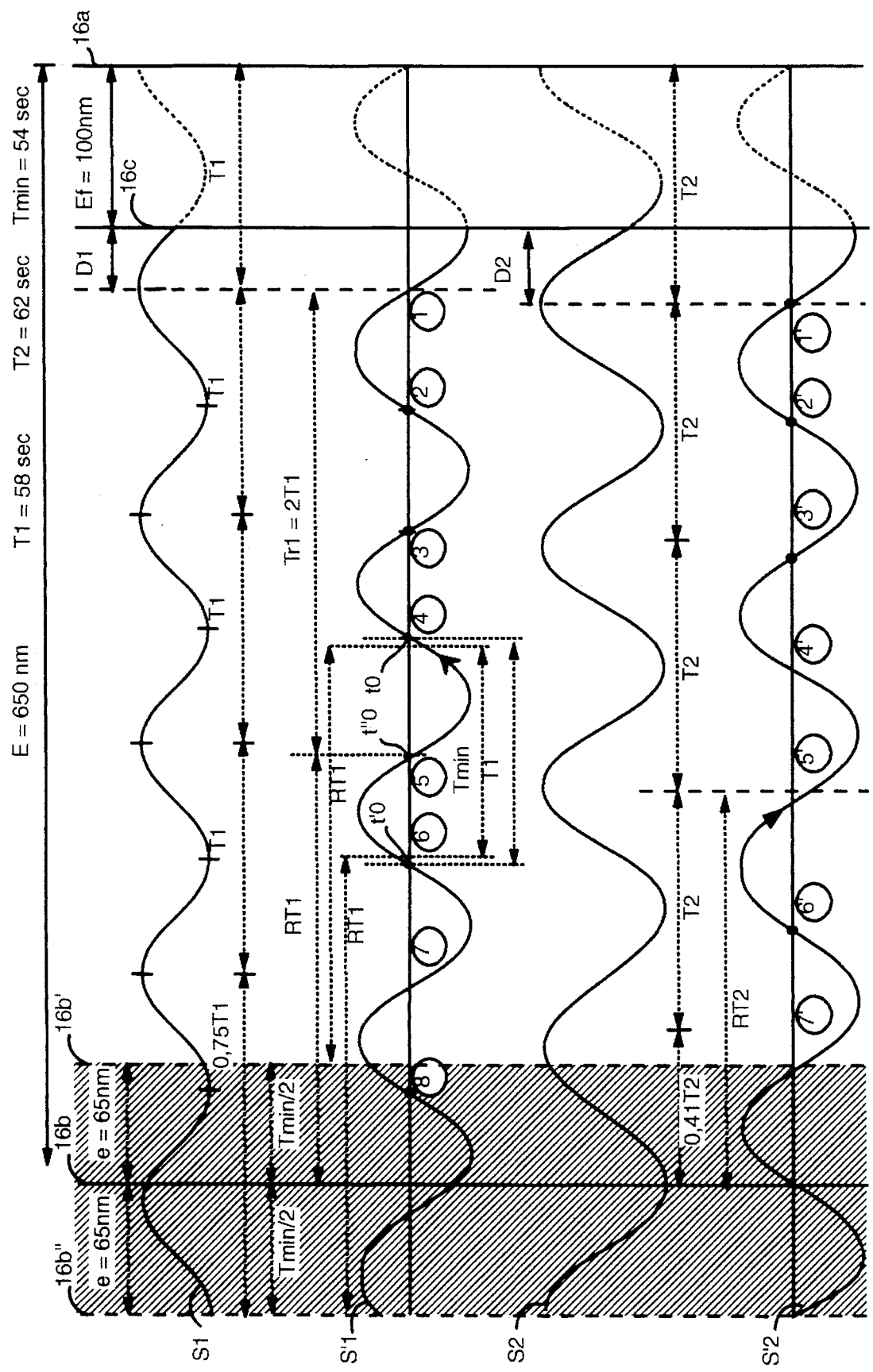
FIG. 5B shows the signals illustrated in FIG. 5A when the thickness error e is taken in consideration.

The difficulty of accurately etching to a given thickness is illustrated in FIG. 5B, which is derived from FIG. 5A. As apparent from FIG. 5B, etching of a product wafer may begin at any point of the curves representing primary signals S1 and S2 in the hatched zone as a result of the thickness error e due to process variations.

Figure 6:
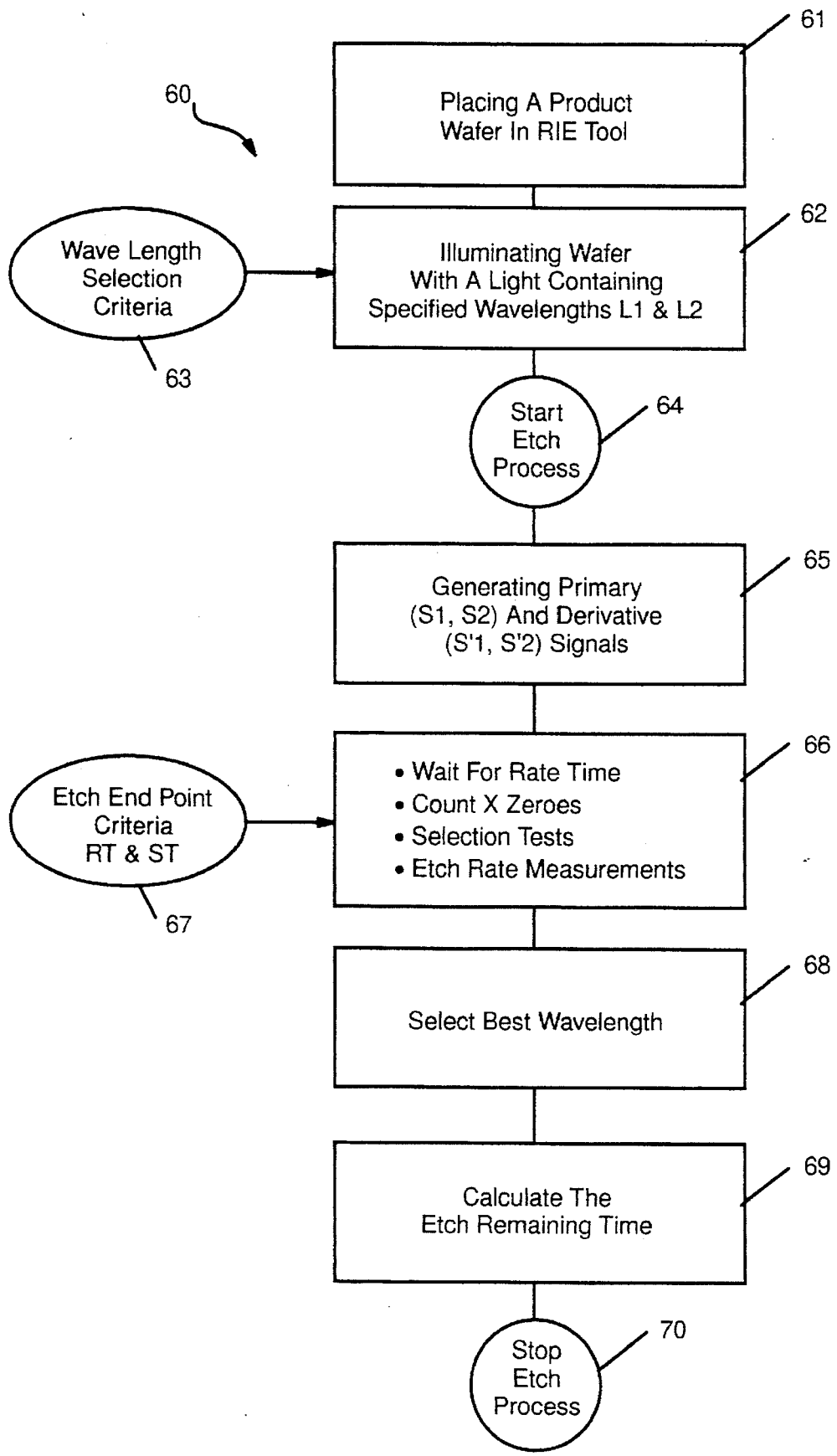
FIG. 6 shows a flow chart that illustrates the essential steps of the method of monitoring the dry etching of a dielectric film formed on a substrate down to a given thickness, according to the present invention.

Assuming the etch end point criteria to be determined as described above, the flow-chart referenced 60 in FIG. 6 shows the essential processing steps of the method for monitoring the dry etching of a dielectric film down to a given thickness Ef or STOP THICKNESS. The first principle of the present invention calls for continuously monitoring the remaining thickness of the $SiO_2$ layer 15 from the $SiO_2/Si_3N_4$ interface 16a and not to measure the etched depth from the top surface 16b of the $SiO_2$ layer 15. The second principle is to use at least two wavelengths whose values are determined by the thickness error e. The use of two wavelengths allows to eliminate the thickness error e of the optical characteristic dispersions in stack 12 and, in particular, of the possible misadaptation between a selected wavelength and the refractive index N of the $SiO_2$ layer 15 that are similarly caused by said process variations. The essential steps of monitoring etching of the product wafers of a similar type as the sample wafer used for calibrating the system 20 will be now described by reference to FIG. 6.

Once the system 20 has been calibrated, the first product wafer of the lot is introduced in the etching equipment 21 (61). The wafer is illuminated by a light containing radiations having wavelengths L1 and L2 (62), provided with appropriate values (63). The etching process is then initiated (64). Primary signals S1 and S2 and respective derivative signals S'1 and S'2 are generated by the computer (65). While the etch process progresses, the computer 36 waits for a delay equal to the RATE TIME RT before initiating the analysis primary/derivative signals S1/S'1 and S2/S'2. Therefore, computer 36 plots the graphs of the pairs of signals S1/S'1 and S2/S'2, but refrains from analyzing them until the respective RATE TIMES RT1 and RT2 have elapsed. Then, the computer simultaneously performs a number of tasks for each primary signal (66). More specifically, it counts the number X1 and X2 of zeroes to detect the last zero of derivative signals S'1 and S'2 before the surface 16c corresponding to the thickness Ef is reached. It also selects the tests of comparing the two pairs of signals S1/S'1 and S2/S'2 over the minimum period of time (i.e., a full period) to be capable of determining the best pair.

Additionally, it calculates the etch rates ER1 and ER2. Before the earliest of the two zeroes (1) and (1') is reached, it selects the most adequate signal/wavelength pair and determines the remaining time dt1 or dt2, depending on the selected wavelength. Assuming that the best signal pair is S1/S'1, as soon as the zero labelled (1) is reached, the computer counts down the remaining time dt1 (that was previously computed) to 0, stops the etching process by activating line 38 in FIG. 3. As a result, the etch process terminates exactly at the etch end point, i.e., at surface 16c. All these operations are performed in (66) using the etch end point criteria stored in (67) which will now be described in more detail.

Still referring to signals S1 and S'1, as apparent from FIG. 5B, and depending on the initial point of etching (somewhere in the hatched zone), the first zero met by the computer after the rate time RT1 has elapsed will be either the zero labelled (5) or the zero labelled (4). This uncertainty is no longer a problem, since, according to an essential characteristic of the present invention, all the disadvantages caused by the thickness error e are now eliminated. This is a direct result from the choice of wavelength L1, (L1>Lmin) and the value of component A1 of the STOP THICKNESS parameter ST1=A1 X1 D1=+4 37.

Still referring to FIG. 5B, if the product wafer is at the maximum thickness of the specification, i.e., E+e, the "time disregarding period" from the origin (t=0 at surface 16b") corresponds to t'0 on the time axis, just after the zero labelled (6). The first zero met by the computer is therefore the zero labelled (5) on a downward transition (A1=+) which is identified as such by the computer. The computer knows that it will count four zeroes (X1=4) from the zero labelled (5), the latter being excluded from the count. Alternatively, if the product wafer is at the minimum thickness of the specification, i.e., E–e, the "time disregarding period" now corresponds to t"0 from the origin (t=0 at surface 16b'), just before the zero labelled (4). In this case, because the computer meets the first zero on an upward transition, it knows that four zeroes have to be counted, including the zero labelled (4). In both cases, the first zero to be taken into consideration, once the "time disregarding period" (given by the rate time RT1) has elapsed, is the zero labelled (4). Similar reasoning applies to signals S2 and S'2. The choice for selecting wavelengths L1 and L2 thus ensures that the "time disregarding period" be centered around the zero labelled (5), which is within one period T1. In other words, the time interval t'0–t"0=Tmin, where Tmin<T1, as apparent from FIG. 5B. This feature is a determining factor to eliminate the uncertainty mentioned above.

To end the etch process at the desired etch end point, the remaining time dt is also determined. The remaining time is the time necessary to reach the etch end point at surface 16c from the last extremum. In turn, the remaining time dt requires that the value of the etch rate ER be also determined. This etch remaining time is given by dt=D/ER, wherein D is known from the stop thickness ST parameter. As a result, while the etch process progresses, the etch rate ER is accurately determined in-situ for the product wafer by performing a few measurements. Because this value cannot be easily obtained in real time, it is approximated by an average etch rate value on a preceding period, e.g., between zeroes labelled (4) and (2) of signal S'1. Since two successive zeroes of the S'1 signal are separated by a thickness reduction equal to L1/4*N, in order to determine the respective etch rate values ER1(1) and ER1(2), a first measurement will be performed between zeroes labelled (4) and (3), followed by a measurement between zeroes labelled (3) and (2). Each measurement is made over a half-period so that the two measurements remain within one period T1. To date, the minimum time to complete the etch rate measurement appears to be half-period. The upper limit is determined by the time that is necessary to travel from the selected zero to the given thickness. In the present case, a full period appears to be the optimum time, whereas the etch rate ER1=(ER1 (1)+ER1(2))/2. Similar reasoning applies to determining ER2. In the experiment illustrated in conjunction with FIG. 5B, it has been found ER1=140 nm/min and ER2=145 nm/min.

In order to determine the best pair of primary signals for a particular refractive index N of the wafer being processed, the selection tests can be performed in the same two half-period intervals between zero locations (4) and (3) on the one hand, and (3) and (2), on the other. For each pair of signals, two categories of test criteria are adopted. The first is related to the symmetry of the curves depicting the signal pair S/S' and the second, to the etch rate value ER. The comparison between signal pairs S1/S'1 and S2/S'2 is analyzed in order to determine which is to be selected. This can be achieved in a number of ways including the use of expert systems or neuron based processors.

The implementation of the first category of criteria, which necessitates three symmetry related tests, will now be described. For convenience sake, these tests are made by reference to signal pair S1/S'1. They include: measuring the amplitudes i1 and i2 of two successive extrema (they are directly related to signal intensity) of primary signal S1, the distances and the curved surfaces between two successive zeroes for the portion of the derivative signal S'1 between zeroes labelled (4) and (3) and between (3) and (2), respectively. The results are compared to determine if they are identical. The closer they are, the better the symmetry of signal pair S1/S'1 will be. The second category of tests consists of conducting different etch rate measurements during the same period and checking that the value does not significantly change with time. As soon as computer 36 detects a significant change in the etch rate value, the corresponding signal pair and, thus, the corresponding wavelength are disregarded. Similar selection tests and analysis are conducted on signal pair S2/S'2. Tolerated variations with regard to these tests are inputted in the computer. As a result, whenever a result is not acceptable for a determined primary signal, the latter is dismissed by the computer. The best primary signal and, thus, the corresponding wavelength are selected in to (68). The selection criterion discussed above is not apparent from FIG. 5B because signals S1 and S2 have been illustrated having an ideal shape. This assertion will be better understood in conjunction with FIGS. 7 and 8, which are computer printouts taken during the monitoring of etching a product wafer, according to the monitoring method of the present invention.

Figure 7:
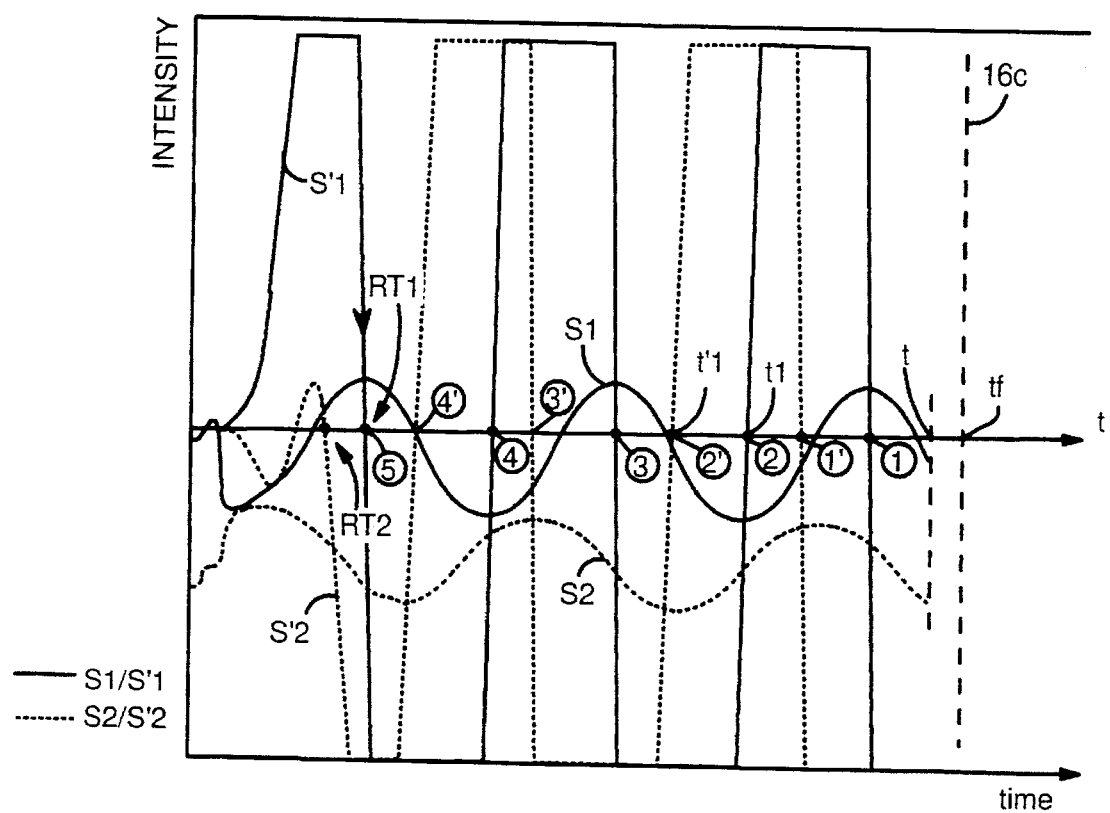
FIG. 7 shows the waveforms of signals S1/S'1 and S2/S'2, when both wavelengths are adapted to the refractive index N of the dielectric film.
Figure 8:
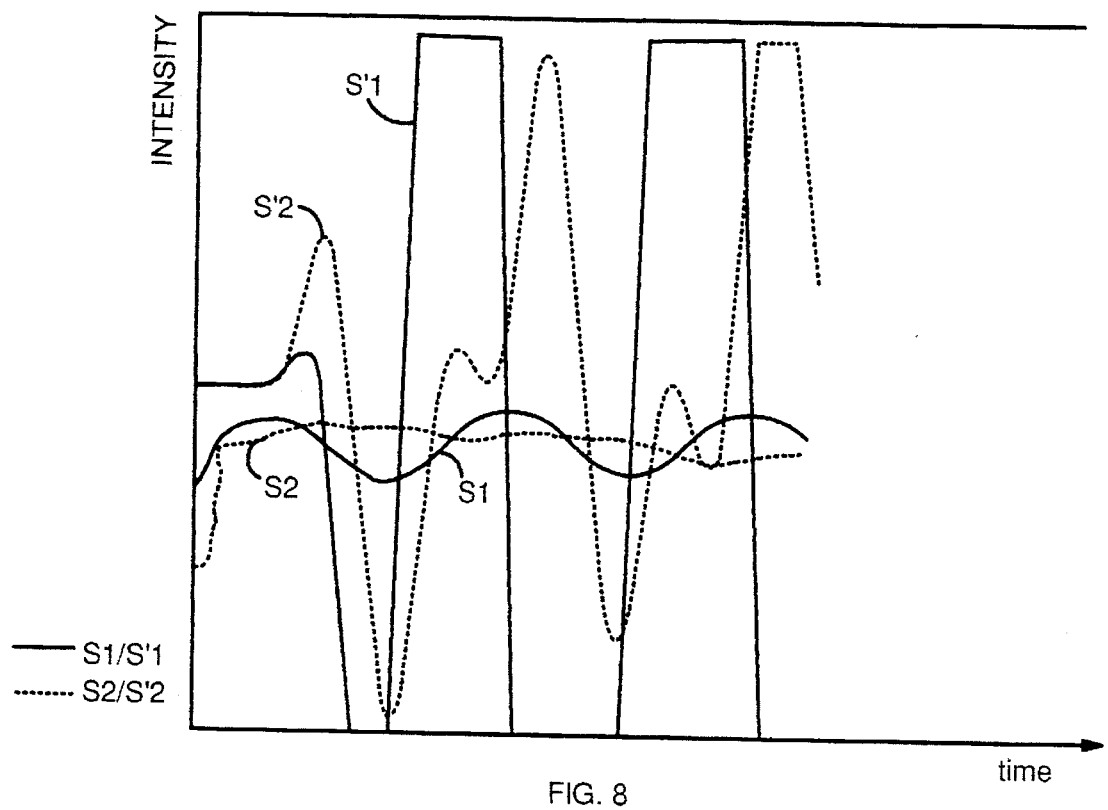
FIG. 8 shows the waveforms of signals S1/S'1 and S2/S'2, when the wavelength of signal S2 is not adapted to the refractive index N.

FIGS. 7 and 8 illustrate the waveforms that are obtained during the etch process of product wafer that were used by computer 36 and by operators servicing the RIE tool. [Note that the nominal thickness of the product wafer that was used for these experiments is not the 650 nm shown on top of FIG. 5B].

Referring to FIG. 7, curves are shown that illustrate two primary signals S1 and S2 at time t, a few seconds before the etch process stops. As apparent from FIG. 7, signals S1 and S2 are perfectly well adapted to the optical properties of stack 12 and in particular to the refractive index N of the SiO₂ layer 15 of the wafer under consideration. Obviously, either primary signal S1 or S2 is adequate and, thus, either wavelength L1 or L2 may be selected. The selection tests preferably terminate at time t1 (the latest of the two elapsed times t1 and t'1) for both signals S1 and S2, before making a decision. Alternatively, FIG. 8 shows a primary signal S2 that is totally misadapted to stack 12 and to the refractive index N. In this case, wavelength L2 must obviously be disregarded. Indeed, as apparent from the comparison between signals S1 and S2 of FIG. 8, as far as the symmetry criteria is concerned, it is clear that signal S2 not only lacks good periodicity, but it also shows poor intensity. Signal S2 would also fail the etch rate test because of inadmissible variations as a function of time.

Assuming signal S1 of FIG. 5B to be selected by the computer. The computer can now terminate the etch operation, according to (69). The remaining time dt1 corresponds to the time to travel from the last extremum of curve S1 corresponding to the zero labelled (1) of curve S'1 to surface 16c (etch end point). It thus requires the knowledge of the etch rate value ER1 that was previously calculated for the wafer being etched. The remaining time dt1=D1/ER1, D1 being available from the STOP THICKNESS parameter ST1. For, D1=37 nm, dt1=37*60/140=16 sec. For signal S2, with D2=47 nm and ER2=145 nm, the corresponding remaining time value would have been given by dt2=19 sec. When this time has elapsed, the etch process stops as indicated by (70). This indicates that the surface 16c has been reached and that the real thickness of the remaining $SiO_2$ layer 15 is very close to the desired value Ef.

Although, the monitoring method of the present invention has been described by separating the preliminary steps of determining the etch end point criteria using a sample wafer, practitioners of the art will understand that the sample wafer may be a product wafer selected from a lot to be processed, provided that care is exercised not to etch in excess so as not to waste it, as was mentioned above.

If the technology is capable of producing the stack 12 with no optical characteristic dispersions or if a dedicated site is specifically used for that purpose, the use of one wavelength instead of two can also be envisioned.

The monitoring method of the present invention has definite advantages. First of, the $SiO_2$ layer 15 is etched down to a given thickness with great accuracy. In addition, it allows a significant reduction of processing time because ex-situ measurements are no longer required, the number of processing steps is reduced, therefore minimizing the risk of human errors. The processing time is also optimized, and it is equal to the time necessary to reach the given thickness. Furthermore, there is a significant reduction in rework as a result of the good reproducibility of the $SiO_2$ remaining layer 15 thickness that is finally obtained. As a direct consequence, there is less contamination and manufacturing yields are improved. The use of at least two specified wavelengths combined with a large size light beam allows to eliminate optical characteristic dispersions in stack 12. However, as explained before, in certain cases, the use of a small size light beam and only one specified wavelength could be envisioned as well. Finally, the etch rate measurement not only provides an accurate value in-situ and on-line for the product wafer being processed but it also allows to directly control any drift of the etching process parameters, thereby providing valuable information for intelligent maintenance of the etching equipment 21.

Whereas this invention has been described with respect to a preferred embodiment, it will be understood by one skilled in the art that various changes inform and detail may be made therein without departing from the scope and spirit of the invention.

What is claimed is:

1. An apparatus for etching a semiconductor substrate having an insulating layer formed thereon, the apparatus automatically terminating etching upon reaching a predetermined thickness Ef of the insulating layer, comprising:

an etch chamber having a view-port formed in one wall thereof, wherein the substrate is inserted to receive an etch treatment;

light source means for generating light having at least two wavelengths, said wavelengths having a value greater than 4*N*e, wherein N is the refractive index of said insulating layer and e is the thickness error of said insulating layer;

optical means for transporting light from said light source means to illuminate an area of said substrate, wherein said light shines through said view port at a substantially normal angle of incidence, and for collecting said light reflected from said insulated substrate;

coupled to said optical means, spectrometer means tuned to a predetermined wavelength for converting said reflected light into at least two analog interference signals having an intensity that varies with a reaction time; and signal processing and analyzing means comprising:
means for digitizing said analog interference signals to generate respective digital primary signals;
means for initiating an analysis of said primary signals, said analysis being initiated a predetermined amount of time after said etching has begun and defining a selected extremum for each of said primary signals;
means for counting a predetermined number of said extrema starting from said selected extremum and up to the last of said extremum of each of said primary signals prior to reaching said predetermined thickness Ef of said insulating layer;
means for determining a distance between said last extremum and said preselected thickness;
means for measuring in-situ etch rates for each of said primary signals;
means for analyzing symmetry of waveforms of said primary signals and said etch rate variations to identify a singular of said waveforms that is best adapted to the composition of said dielectric layer;
means for determining a remaining time for the selected said primary signal; and
means for terminating said etching process upon elapse of said remaining time.

2. The apparatus as in claim 1, wherein operations performed by said signal processing and analyzing means are performed on a signal derived from said primary signals by numeric filtering.

3. The apparatus as in claim 1, wherein said light source means is a multi-wavelength light source.

4. The apparatus as in claim 3, wherein said multi-wavelength light source is selected from the group that consists of a mercury, a halogen and a xenon polychromatic light source.

5. The apparatus as in claim 3, wherein said multi-wavelength light source comprises a plurality of lasers, each having a determined wavelength.

6. The apparatus as in claim 3, wherein said multi-wavelength light source comprises at least one monochromatic laser and one polychromatic light source.

7. The apparatus as in claim 1, wherein said optical means includes a condenser lens.

8. The apparatus as in claim 1, wherein one of said wavelengths is combined with said illumination of said area of said substrate.

* * * * *